United States Patent
Tan et al.

(10) Patent No.: US 9,864,827 B1
(45) Date of Patent: Jan. 9, 2018

(54) SYSTEM AND METHOD FOR MODELING ELECTRONIC CIRCUIT DESIGNS

(71) Applicant: Cadence Design Systems, Inc., San Jose, CA (US)

(72) Inventors: Jilin Tan, Nashua, NH (US); Jian Chen, Milpitas, CA (US); Jian Liu, Dublin, CA (US); An-Yu Kuo, San Jose, CA (US); Tiejun Yu, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/973,064

(22) Filed: Dec. 17, 2015

Related U.S. Application Data

(60) Provisional application No. 62/241,361, filed on Oct. 14, 2015.

(51) Int. Cl.
  *G06F 17/50* (2006.01)
(52) U.S. Cl.
  CPC ...... *G06F 17/5072* (2013.01); *G06F 17/5077* (2013.01)
(58) Field of Classification Search
  USPC ........................................................ 716/115
  See application file for complete search history.

(56) References Cited

U.S. PATENT DOCUMENTS

| | | | | |
|---|---|---|---|---|
| 7,143,022 B1 * | 11/2006 | Wang | .................. | G06F 17/5036 703/14 |
| 7,277,841 B1 * | 10/2007 | Novak | ................ | G06F 17/5036 703/18 |
| 8,046,730 B1 * | 10/2011 | Ferguson | ............ | G06F 17/5068 716/100 |
| 8,200,445 B2 * | 6/2012 | Kashiwakura | ...... | G06F 17/5036 702/191 |

* cited by examiner

*Primary Examiner* — Eric Lee
(74) *Attorney, Agent, or Firm* — Mark H. Whittenberger, Esq.; Holland & Knight LLP

(57) ABSTRACT

The present disclosure relates to a system and method for modeling an electronic circuit design. Embodiments may include receiving, at one or more computing devices, an electronic circuit design. Embodiments may also include partitioning, at a graphical user interface configured to display at least a portion of the electronic circuit design, at least one portion of the electronic circuit design into one or more sub-zones and generating, at the graphical user interface, one or more ports at each interface between one or more sub-zones. Embodiments may further include receiving a selection for an electromagnetic (EM) solver for each of the one or more sub-zones. Embodiments may also include modeling each of the one or more sub-zones.

20 Claims, 13 Drawing Sheets

FIG. 12

SYSTEM AND METHOD FOR MODELING ELECTRONIC CIRCUIT DESIGNS

RELATED APPLICATIONS

The subject application claims the priority of Provisional Application No. 62/241,361, filed on Oct. 14, 2015, the contents of which are herein incorporated by reference in their entirety.

FIELD OF THE INVENTION

The present disclosure relates to electronic design automation (EDA), and more specifically, to a method for modeling an electronic circuit design.

DISCUSSION OF THE RELATED ART

EDA utilizes software tools that may be used in the design and analysis of numerous electronic systems such as printed circuit boards (PCBs) and integrated circuits (ICs). Some EDA tools are configured to model electronic circuit designs. Modeling electronic circuit designs can include performing a signal integrity analysis of a signal link channel. In some electronic circuit designs, a signal link channel may be long (e.g., a length greater than 200 mm) and a signal integrity analysis may need to model up to 25 GHz or higher. Using a 3D full-wave EM solver to model the entire electronic circuit design will generate a very accurate model, however it will also impose many modeling challenges, like high-capacity, and usually puts the simulation time over weeks and requires huge memory. On the other hand, signal link channels routed uniformly on a layer with a reference plane can be modeled by a 2D transmission line hybrid solver with significantly reduced simulation efforts. Therefore it may be of interest to use 2D transmission line hybrid solvers, 2.5D EM solvers and/or 3D EM solvers together in the modeling of an electronic circuit design.

SUMMARY OF INVENTION

In one or more embodiments of the present disclosure, a computer-implemented method for modeling an electronic circuit design is provided. The method may include receiving, at one or more computing devices, an electronic circuit design. The method may also include partitioning, at a graphical user interface configured to display at least a portion of the electronic circuit design, at least one portion of the electronic circuit design into one or more sub-zones and generating, at the graphical user interface, one or more ports at each interface between one or more sub-zones. The method may further include receiving, at the graphical user interface, a selection for an electromagnetic (EM) solver for each of the one or more sub-zones. The method may also include modeling each of the one or more sub-zones.

One or more of the following features may be included. In some embodiments, the method may include modeling the at least one portion of the electronic circuit design based upon, at least in part, the modeling of each of the one or more sub-zones. In some embodiments, modeling each of the one or more sub-zones may be based upon, at least in part, the EM solver for each of the one or more subzones. In some embodiments, the EM solver may be one or more a 2D transmission line hybrid solver, a 2.5D EM solver, and a 3D full-wave EM solver. The method may further include reducing a trace length of one or more traces at one or more ends at each interface between the one or more sub-zones. The method may also include generating one or more edge shapes to align with each interface between the one or more sub-zones. The method may further include routing the one or more ports from the one or more traces to the one or more edge shapes. The method may also include generating one or more simulated connections on the one or more edge shapes to interconnect one or more sub-zones with one or more portions of the electronic circuit design. Modeling each of the one or more sub-zones may include determining one or more S-parameters for each of the one or more sub-zones.

In some embodiments, a computer-readable storage medium for modeling an electronic circuit design is provided. The computer-readable storage medium may have stored thereon instructions that when executed by a machine result in one or more operations. Operations may include may include receiving, at one or more computing devices, an electronic circuit design. Operations may also include partitioning, at a graphical user interface configured to display at least a portion of the electronic circuit design, at least one portion of the electronic circuit design into one or more sub-zones and generating, at the graphical user interface, one or more ports at each interface between one or more sub-zones. Operations may further include receiving, at the graphical user interface, a selection for an electromagnetic (EM) solver for each of the one or more sub-zones. Operations may also include modeling each of the one or more sub-zones.

One or more of the following features may be included. In some embodiments, operations may include modeling the at least one portion of the electronic circuit design based upon, at least in part, the modeling of each of the one or more sub-zones. In some embodiments, modeling each of the one or more sub-zones is based upon, at least in part, the EM solver for each of the one or more subzones. In some embodiments, the EM solver may be one or more a 2D transmission line hybrid solver, a 2.5D EM solver, and a 3D full-wave EM solver. Operations may further include reducing a trace length of one or more traces at one or more ends at each interface between the one or more sub-zones. Operations may further include generating one or more edge shapes to align with each interface between the one or more sub-zones. Operations may further include routing the one or more ports from the one or more traces to the one or more edge shapes. Operations may further include generating one or more simulated connections on the one or more edge shapes to interconnect one or more sub-zones with one or more portions of the electronic circuit design. Modeling each of the one or more sub-zones may include determining one or more S-parameters for each of the one or more sub-zones.

In one or more embodiments of the present disclosure, a system may include a computing device having at least one processor configured to model an electronic circuit design. The system may include a computing device having at least one processor configured to receive an electronic circuit design. The at least one processor may be further configured to partition, at a graphical user interface configured to display at least a portion of the electronic circuit design, at least one portion of the electronic circuit design into one or more sub-zones and generate, at the graphical user interface, one or more ports at each interface between one or more sub-zones. The at least one processor may be further configured to receive, at the graphical user interface, a selection for an electromagnetic (EM) solver for each of the one or more sub-zones. The at least one processor may be further configured to model each of the one or more sub-zones.

One or more of the following features may be included. In some embodiments, the at least one processor may be further configured to model the at least one portion of the electronic circuit design based upon, at least in part, the modeling of each of the one or more sub-zones.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 12 is a schematic depicting aspects of the electronic circuit design modeling process in accordance with an embodiment of the present disclosure.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

Embodiments of electronic circuit design modeling (ECDM) process 10 shown in FIGS. 1-13 may provide an efficient approach for modeling electronic circuit designs with one or more layers. In other words, embodiments disclosed herein may be configured to "cut" an electronic circuit design into one or more portions and simulate each portion with a user-specified electromagnetic (EM) solver. Simulations of each portion may be "stitched" together to form a model for the entire electronic circuit design and may increase the speed and efficiency of electronic circuit design modeling. Traditional approaches for solving this problem required modeling the entire electronic circuit design with a single EM solver. For designs modeled with a 2D transmission line hybrid solver, the simulation may be computationally simple but may not be as accurate as the model simulated with a 3D full-wave EM solver. However, using a 3D full-wave solver may require substantial computer memory and considerable time to simulate. Embodiments of the present disclosure may allow for modeling of an electronic circuit design with 2D transmission line hybrid solvers, 2.5D EM solvers and/or 3D EM solvers.

Figure 1:
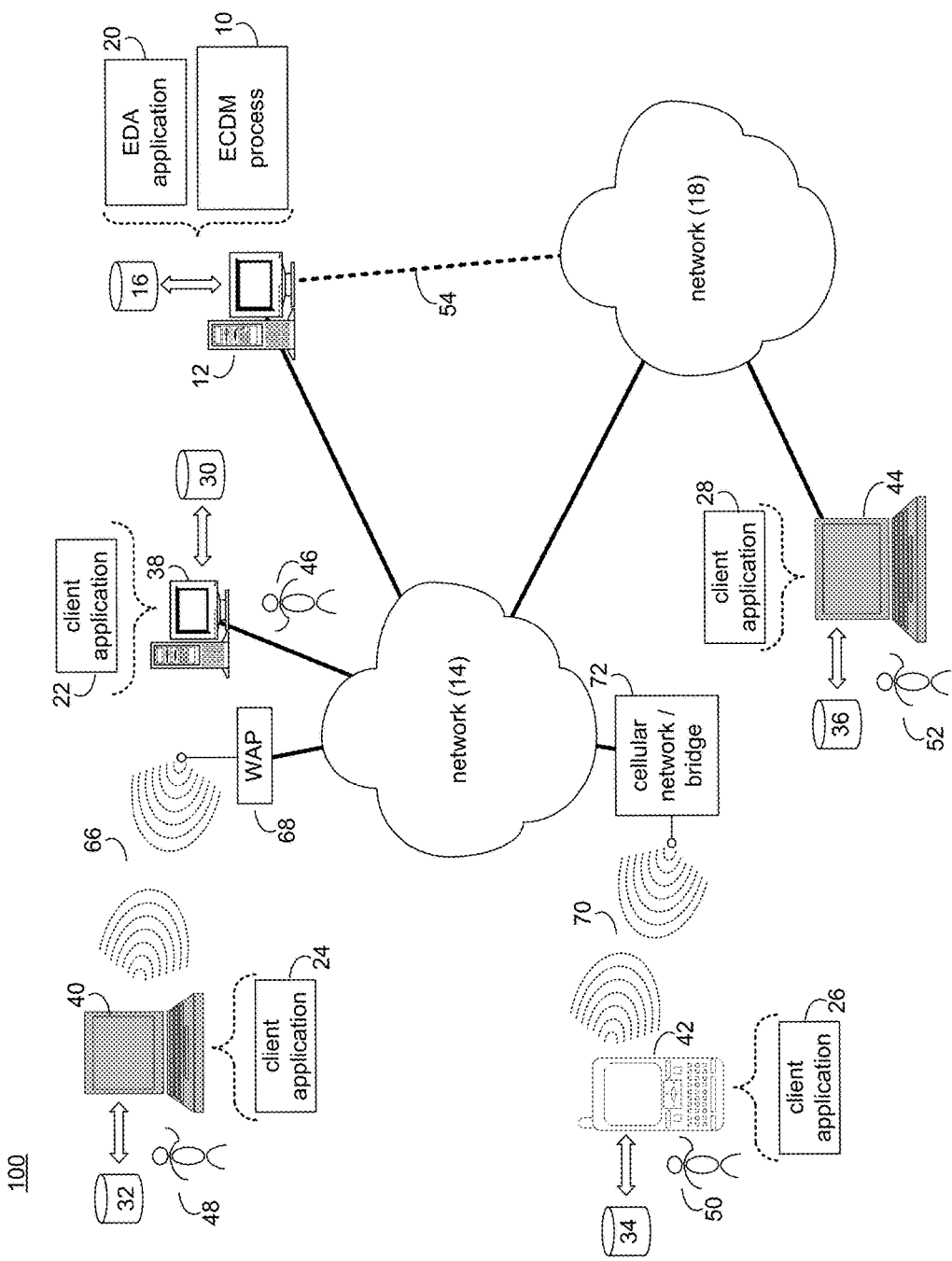
FIG. 1 is a system diagram depicting aspects of the electronic circuit design modeling process in accordance with an embodiment of the present disclosure.

Referring to FIG. 1, there is shown electronic circuit design modeling process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell® NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally / alternatively, the electronic circuit design modeling process may reside on and be executed, in whole or in part, by a client electronic device, such as a personal computer, notebook computer, personal digital assistant, or the like.

The instruction sets and subroutines of electronic circuit design modeling process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (i.e., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28). EDA application 20 may be referred to herein as a design tool.

Electronic circuit design modeling process 10 may be a stand-alone application, or may be an applet / application / script that may interact with and/or be executed within EDA application 20. In addition / as an alternative to being a server-side process, the electronic circuit design modeling process may be a client-side process (not shown) that may reside on a client electronic device (described below) and may interact with an EDA client application (e.g., one or more of EDA client applications 22, 24, 26, 28). Further, the electronic circuit design modeling process may be a hybrid server-side/client-side process that may interact with EDA application 20 and an EDA client application (e.g., one or more of client applications 22, 24, 26, 28). As such, the electronic circuit design modeling process may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize electronic circuit design modeling process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (i.e., the computer that executes EDA application 20) may be connected to network 14 through secondary network 18, as illustrated with phantom link line 54.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (i.e., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (i.e., CSMA/CA) for path sharing. The various 802.11x specifications may use phase-shift keying (i.e., PSK) modulation or complementary code keying (i.e., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows®, Microsoft Windows CE®, Red Hat Linux®, or other suitable operating system. (Windows CE is a registered trademark of Microsoft Corporation in the United States, other countries, or both.).

Figure 2:
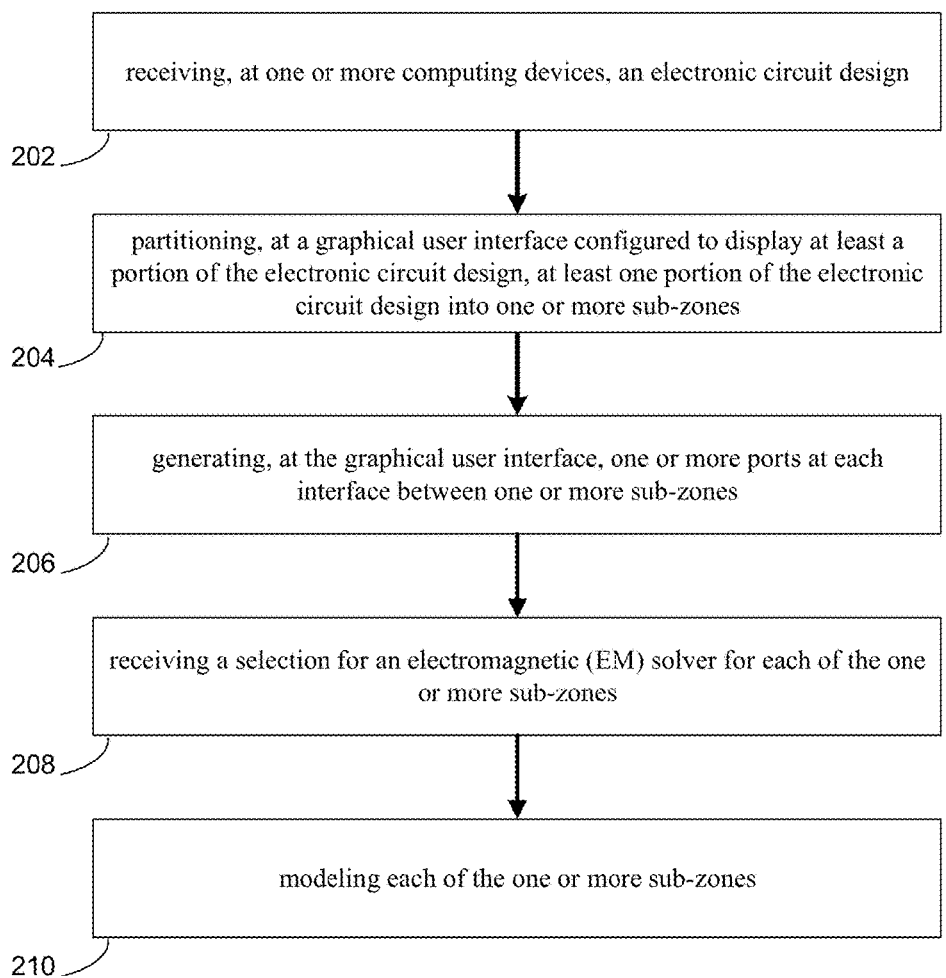
FIG. 2 is a flowchart depicting operations consistent with the electronic circuit design modeling process of the present disclosure.

Referring to FIGS. 2-13, various embodiments consistent with electronic circuit design modeling (ECDM) process 10 are provided. As shown in FIG. 2, embodiments of ECDM process 10 may be configured to model an electronic circuit design. Embodiments of ECDM process 10 may include receiving (202), at one or more computing devices, an electronic circuit design. ECDM process 10 may also include partitioning (204), at a graphical user interface configured to display at least a portion of the electronic circuit design, at least one portion of the electronic circuit design into one or more sub-zones and generating (206), at the graphical user interface, one or more ports at each interface between one or more sub-zones. ECDM process 10 may further include receiving, (208) at the graphical user interface, a selection for an electromagnetic (EM) solver for each of the one or more sub-zones. ECDM process 10 may also include modeling (210) each of the one or more sub-zones. These operations, and others, are discussed in further detail below.

Figure 3:
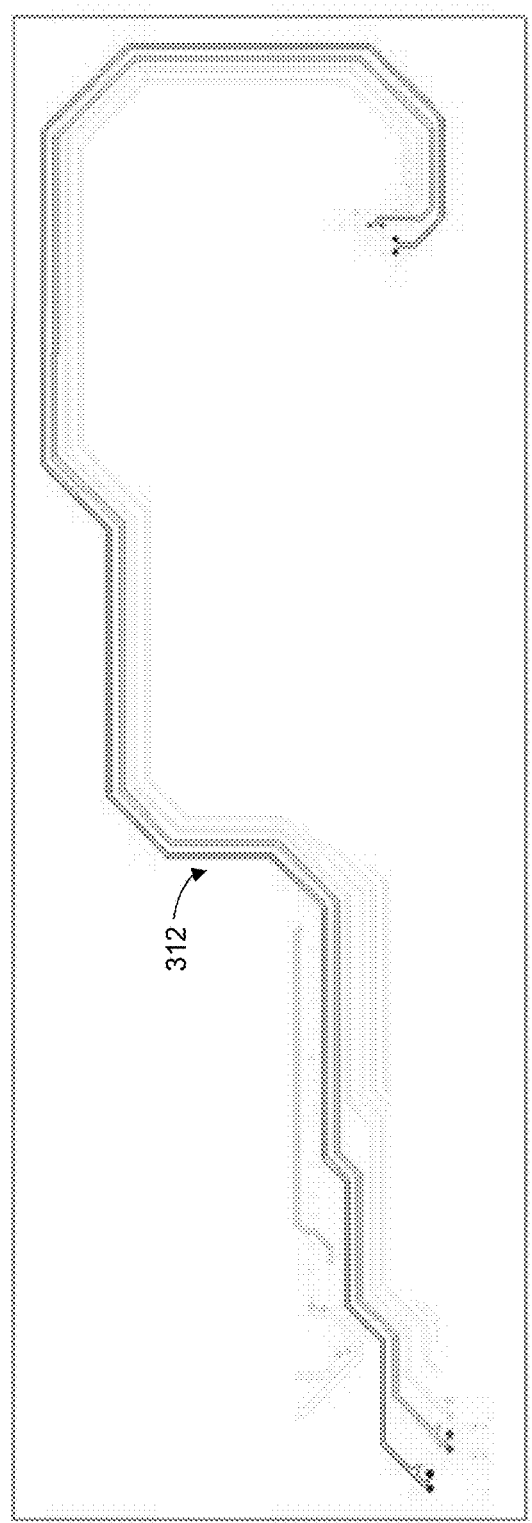
FIG. 3 is a schematic depicting aspects of the electronic circuit design modeling process in accordance with an embodiment of the present disclosure.
Figure 4:
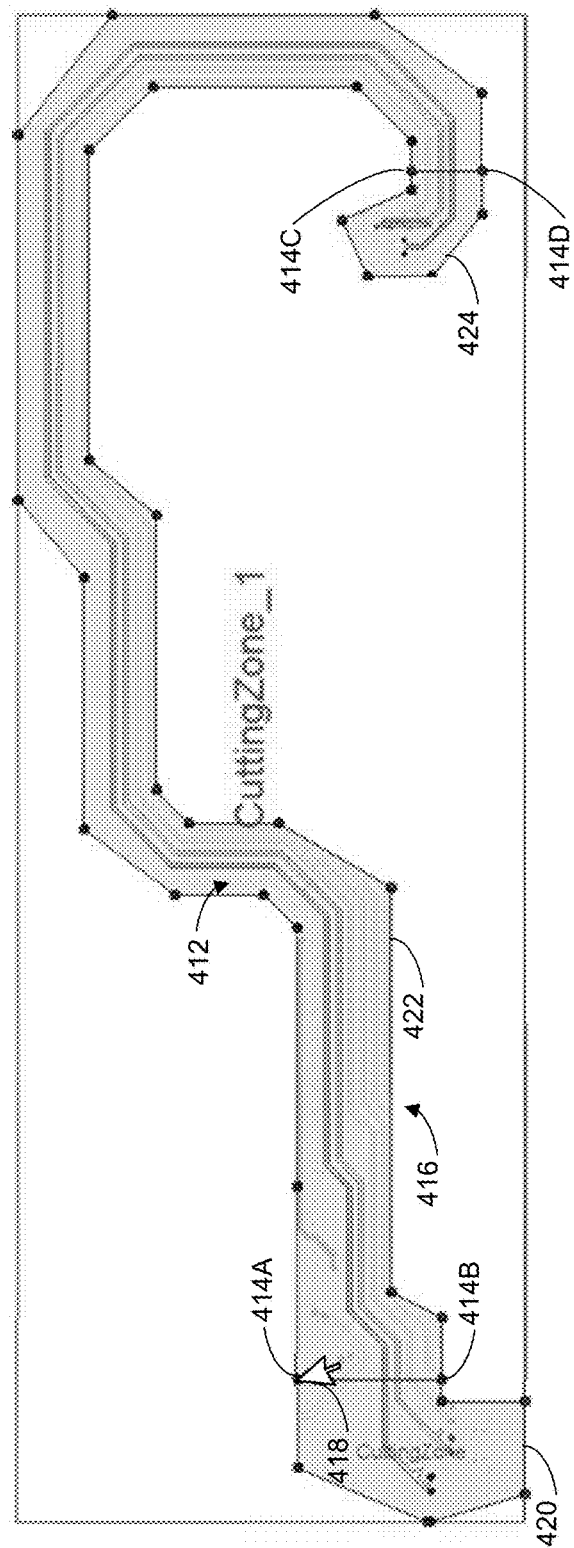
FIG. 4 is a schematic depicting aspects of the electronic circuit design modeling process in accordance with an embodiment of the present disclosure.
Figure 5:
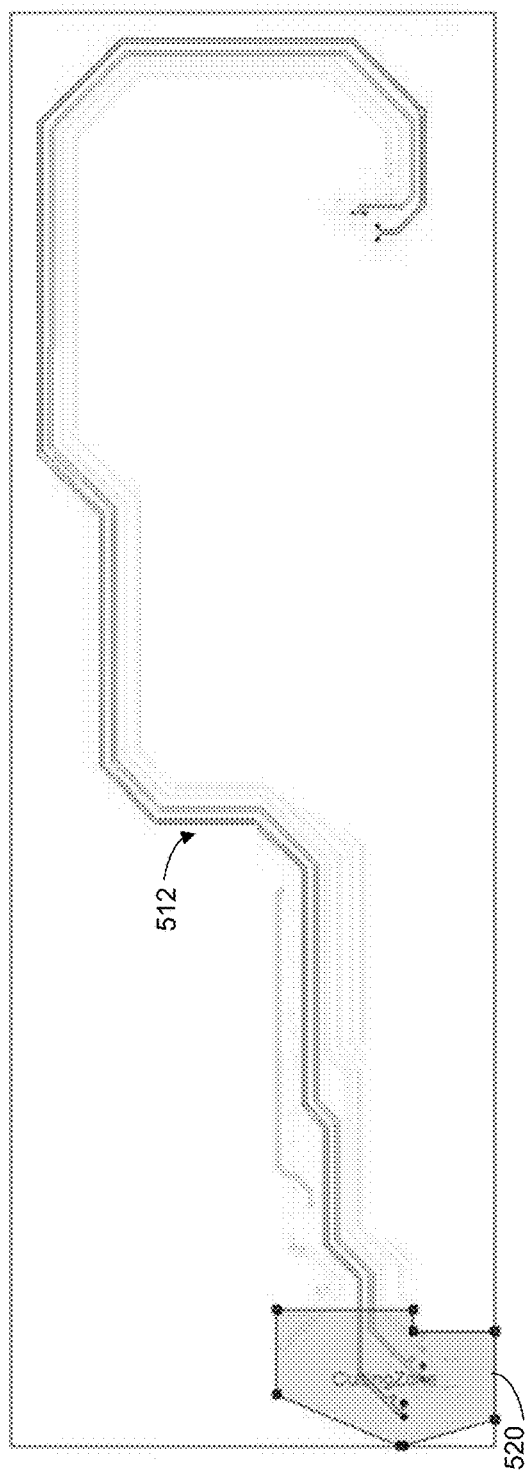
FIG. 5 is a schematic depicting aspects of the electronic circuit design modeling process in accordance with an embodiment of the present disclosure.
Figure 6:
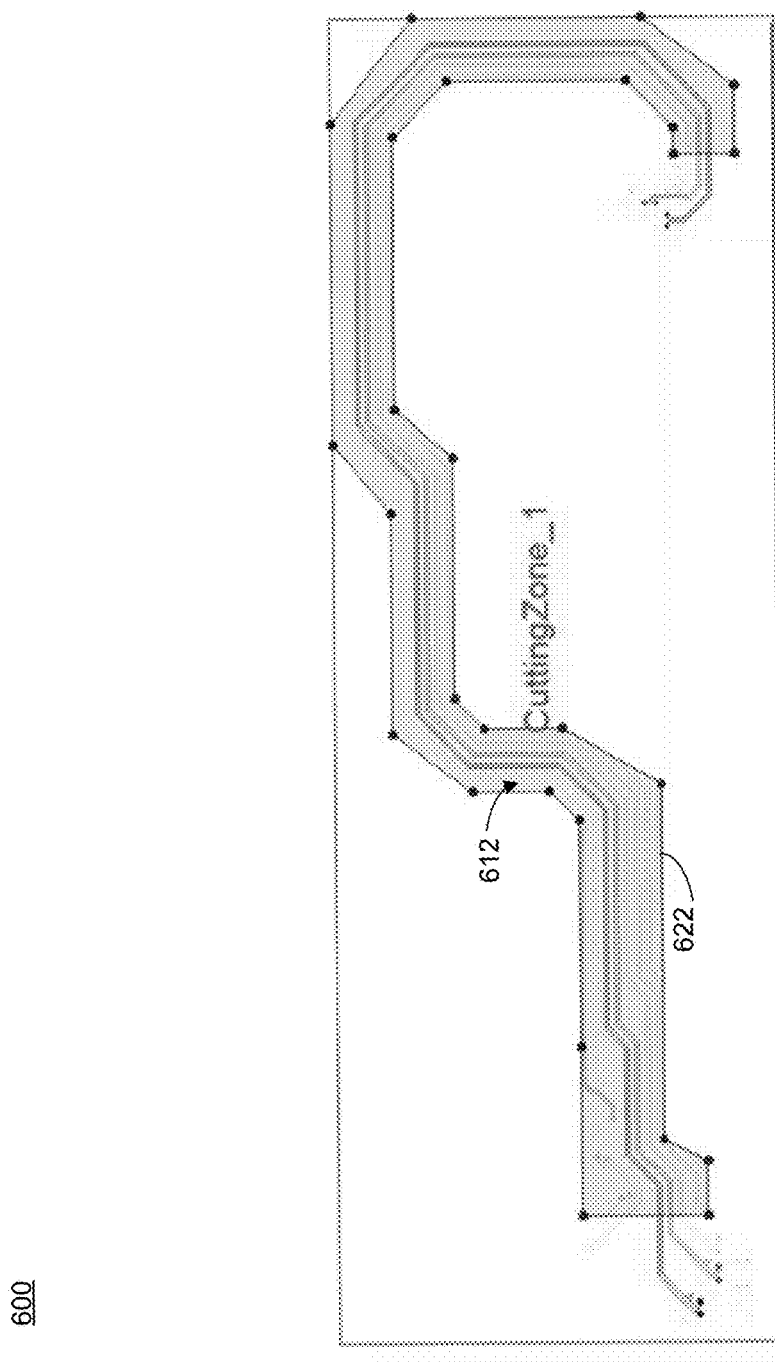
FIG. 6 is a schematic depicting aspects of the electronic circuit design modeling process in accordance with an embodiment of the present disclosure.
Figure 7:
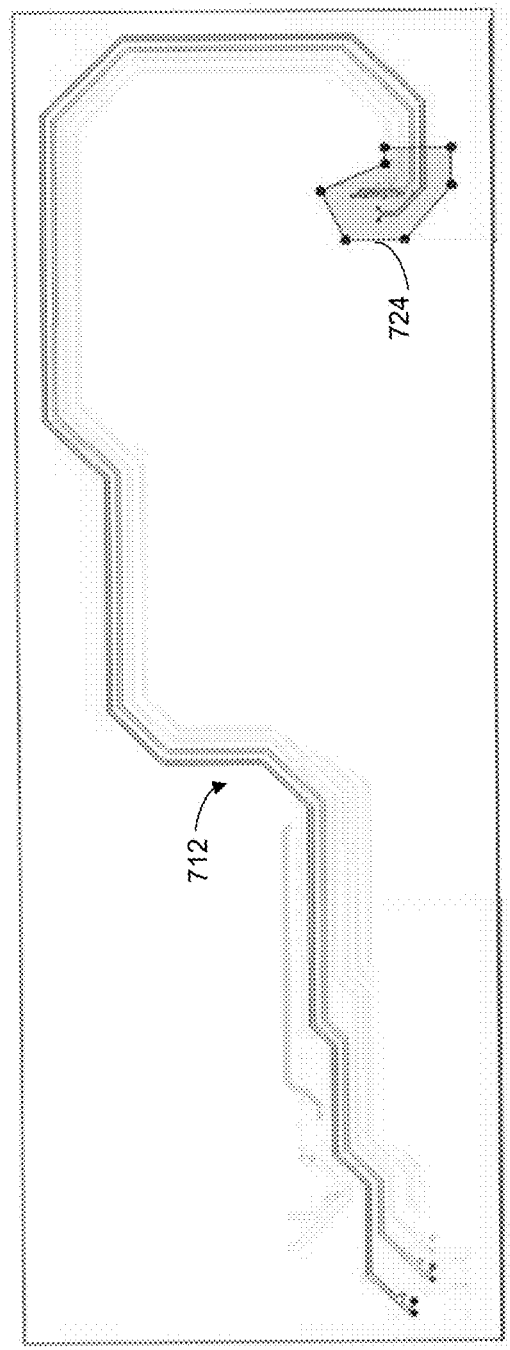
FIG. 7 is a schematic depicting aspects of the electronic circuit design modeling process in accordance with an embodiment of the present disclosure.

In some embodiments and referring to FIG. 3, ECDM process 10 may include receiving (202), at one or more computing devices, an electronic circuit design 312. In some embodiments, an electronic circuit design may include, but is not limited to, an electronic component and/or chip with one or more signal link channels. A signal link channel as used herein may include, but is not limited to, a trace, a channel, and/or a transmission line of an electronic circuit design. As such, signal link channel, trace, channel, and transmission line may all be used interchangeably within the scope of the present disclosure. In some embodiments, a trace routing may start from a footprint of the component and/or chip. However, there may not be enough space for all of the traces in the trace routing to be fanned out on one layer of the component so the traces may need to be routed onto another layer by adding one or more vias. A via, as used herein may include, but is not limited to, a small opening in a layer of the electronic circuit design that may allow a connection between one or more layers of the electronic circuit design. In some embodiments, a via may be a connection between one or more layers. In some embodiments, the one or more traces may be fanned out from a component on a layer until reaching another component. The traces may gather together under the component/chip footprint area through a via and/or other layer-to-layer transitions.

In some embodiments, ECDM process 10 may also include partitioning, (204) at a graphical user interface configured to display at least a portion of the electronic circuit design, at least one portion of the electronic circuit design into one or more sub-zones. Partitioning as used herein may include, but is not limited to, cutting and/or dividing the electronic circuit design or at least a portion of the electronic circuit design into one or more sub-zones. A sub-zone as used herein may include, but is not limited to, a portion of the electronic design. In some embodiments, a sub-zone may include a transition point in an electronic circuit design from one layer to another layer. The sub-zone may include a via and/or other layer-to-layer transition. The sub-zone may be referred to as a "cut zone" where appropriate and within the scope of the present disclosure.

Referring now to FIGS. 4-7, ECDM process 10 may include defining a cutting polygon for one or more channels and/or traces of interest and partitioning the one or more channels into multiple sub-zones. Partitioning the electronic circuit design, or at least one portion of the electronic circuit design, may include selecting one or more signal nets 414A, 414B, 414C, 414D with the aid of the graphical user interface 400 and/or a graphical user interface wizard. In some embodiments, ECDM process 10 may include generating, at a graphical user interface 400, a cutting polygon 416 based on one or more selected signal nets of interest 414A, 414B, 414C, 414D. In some embodiments, ECDM process 10 may use the selected signal nets geometry with a graphical user interface to automatically generate the cutting polygon. In some embodiments, the cutting polygon 416 may enclose at least a portion of the electronic circuit design and may eliminate the remainder of the electronic circuit design outside of the cutting polygon 416. In some embodiments, the cutting polygon 416 may be manually configured by geometries created from the interconnection of one or more signal nets 414A, 414B, 414C, 414D.

In operation, as shown in the example of FIGS. 4-7, a user may generate a cutting polygon 416 for an electronic circuit design 412 by selecting one or more signal nets of interest 414A, 414B with a cursor 418 or other computer input. A user may partition the cutting polygon into one or more sub-zones 420, 422, 424 by connecting one or more signal nets to separate one or more sub-zones. For example, a user may partition a first sub-zone 420 (e.g., CuttingZone) from the cutting polygon 416 by using the cursor 418 to connect signal nets 414A and 414B. In one example, the remaining cutting polygon (e.g., the cutting polygon 416 less the first sub-zone 420) may be referred to as a sub-zone of the original cutting polygon 416. In some embodiments, the connection between signal nets may be a straight line, however, any connection shape may be used within the scope of the present disclosure.

ECDM process 10 may include cutting the cutting polygon into one or more sub-zones. In some embodiments, a user may cut the cutting polygon by connecting one or more signal nets as described above. ECDM process 10 may repeat the previous cutting process to create one or more sub-zones.

In operation and as shown in the examples of FIGS. 4-7, the remaining cutting polygon 416 may be cut again to create a second sub-zone 422 (e.g., CuttingZone_1) and a third sub-zone 424 (e.g., CuttingZone_2) by the connection between signal nets 414C and 414D. In some embodiments, the one or more sub-zones 420, 422, 424 may be cut from the cutting polygon 416 when a user selects a cutting button (not shown) of a graphical user interface 400 based upon, at least in part, the lines drawn between the one or more signal nets 414A, 414B, 414C, 414D. While three sub-zones have been described in the above example, any number of sub-zones may be partitioned from the cutting polygon within the scope of the present disclosure.

In some embodiments, ECDM process 10 may include generating (206), at the graphical user interface, one or more ports at each interface between one or more sub-zones. In some embodiments, partitioning the at least one portion of the electronic circuit design into one or more sub-zones may require one or more ports for each of the one or more sub-zones. A port and/or an intermediate port as used herein may include, but is not limited to, a terminal and/or a point of entry or exit for electrical energy into a sub-zone and/or a portion of the electronic circuit design. In some embodiments, the port may be the point from which a sub-zone and/or a portion of an electronic circuit design is modeled. ECDM process 10 may create ports or intermediate ports in the interface between one or more sub-zones. An interface as used herein may include, but is not limited to, a boundary between one or more sub-zones. In one example, intermediate ports may be generated in the interface between two neighboring zones. For example, referring to FIG. 4, sub-zones 420 and 422 may be two neighboring sub-zones. The interface between sub-zones 420 and 422 may include, but is not limited to, the line between signal nets 414A and 414B. However, in some embodiments, the addition of one or more ports from the cutting of the cutting polygon into one or more sub-zones may introduce parasites. In some embodiments, parasites as used herein may include but are not limited to, additional port inductance and/or capacitance that may be added to a model of the electronic circuit design.

Embodiments of ECDM process 10 may remove the additional effect of the cutting interface between one or more sub-zones by generating one or more ports at one or more ends of a trace with the aid of port wizard (e.g., a graphical user interface). In some embodiments, generating the one or more ports may include geometry manipulation to reduce the port parasites in the interface of the one or more sub-zones, as will be discussed in greater detail below.

Figure 8:
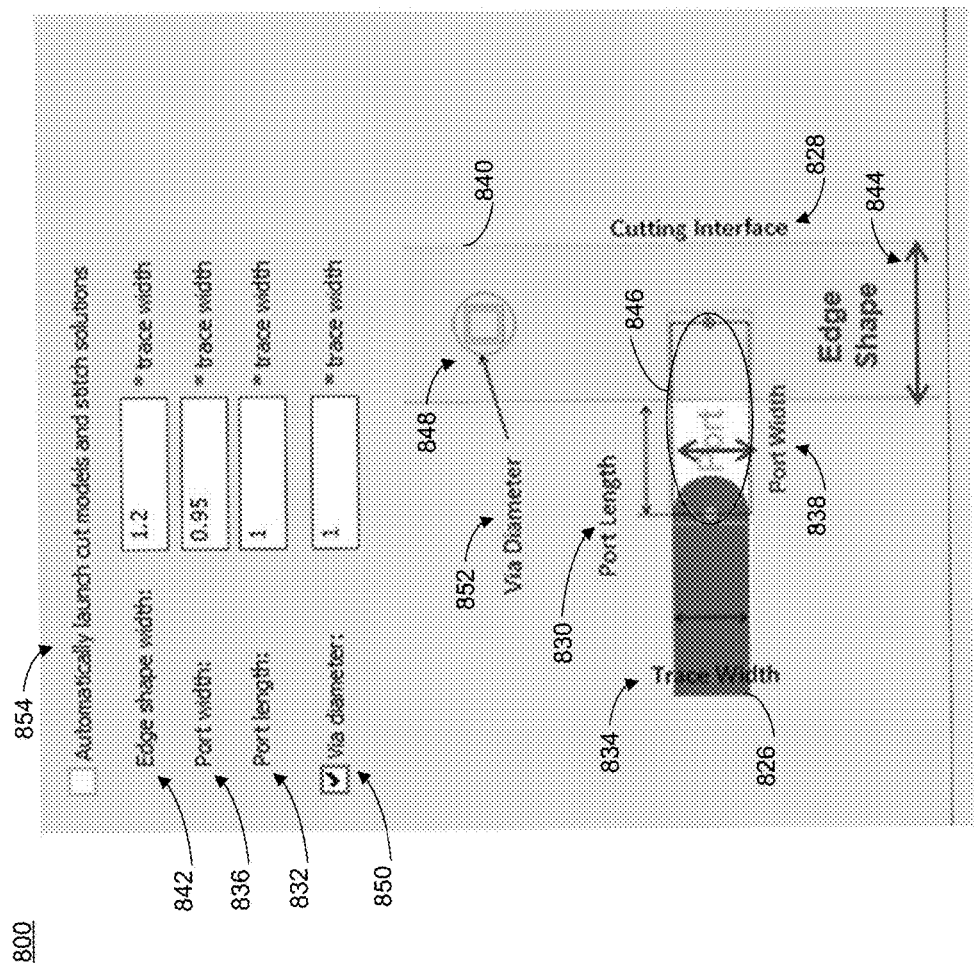
FIG. 8 is a schematic depicting aspects of the electronic circuit design modeling process in accordance with an embodiment of the present disclosure.

Referring now to the exemplary graphical user interface 800 of FIG. 8, ECDM process 10 may include reducing one or more trace lengths of one or more traces 826 at one or more ends at each interface 828 of each of the one or more sub-zones (e.g., cutting interface). The distance the trace length is reduced may be referred to as a port length 830. In other words, the trace length at the interface 828 between one or more sub-zones may be reduced by the port length 830 to allow a port to be placed between the trace 826 and the interface 828. In some embodiments, a port length value 832 may be entered in the graphical user interface 800 as a multiplicative factor of the trace width 834. The port length value 832 may determine the port length 834. In some embodiments, a port width value 836 may be entered in the graphical user interface as a multiplicative factor of the trace width 834. The port width value 836 may determine the port width 838.

In some embodiments, ECDM process 10 may also include generating one or more edge shapes 840 to align with each interface 828 between the one or more sub-zones. Edge shapes 840 as used herein may include, but are not limited to, shapes that may be added to align with the interface (e.g., at the edge) between one or more sub-zones. In some embodiments, an edge width value 842 may be entered in the graphical user interface 800 as a multiplicative factor of the trace width 834. The edge width value 842 may determine the edge shape width 844.

ECDM process 10 may further include routing the one or more ports 846 from the one or more traces 826 to the one or more edge shapes 840. In some embodiments, routing the one or more ports may include generating a port 846 based upon, at least in part, one or more of the port width value 836, the port length value 832, the trace width 834 and the edge width value 844. In some embodiments, routing the one or more ports may be based upon, at least in part, minimizing the parasitic capacitance and inductance introduced into one or more sub-zones.

In some embodiments, ECDM process 10 may also include generating one or more simulated connections on the one or more edge shapes 840 to interconnect one or more sub-zones with one or more portions of the electronic circuit design. Simulated connections as used herein may include, but are not limited to, vias 848 that may be configured to connect one or more sub-zones from one or more layers of an electronic circuit design. Generating one or more simulated connections may include, but is not limited to, adding one or more vias 848 adjacent to the ports to make an electrical connection between the edge shapes and other layers in an electronic circuit design. In some embodiments, a via diameter value 850 may be entered in the graphical user interface 800 as a multiplicative factor of the trace width 834. The via diameter value 850 may determine the via diameter 852. In some embodiments, generating the one or more simulated connections may be based upon, at least in part, minimizing the parasitic capacitance and inductance introduced into one or more sub-zones.

In some embodiments, generating the one or more ports may be automatic. ECDM process 10 may include an option 854 in a graphical user interface for automatically generating the one or more ports. In some embodiments, ECDM process 10 may use empirical estimation to determine one or more of the port width, port length, and edge width, etc., for automatically generating the one or more ports. In some embodiments, automatically generating the one or more ports within ECDM process 10 may include short open calibration (SOC) and/or waveport calibration to eliminate parasitic capacitance and/or inductance.

Figure 9:
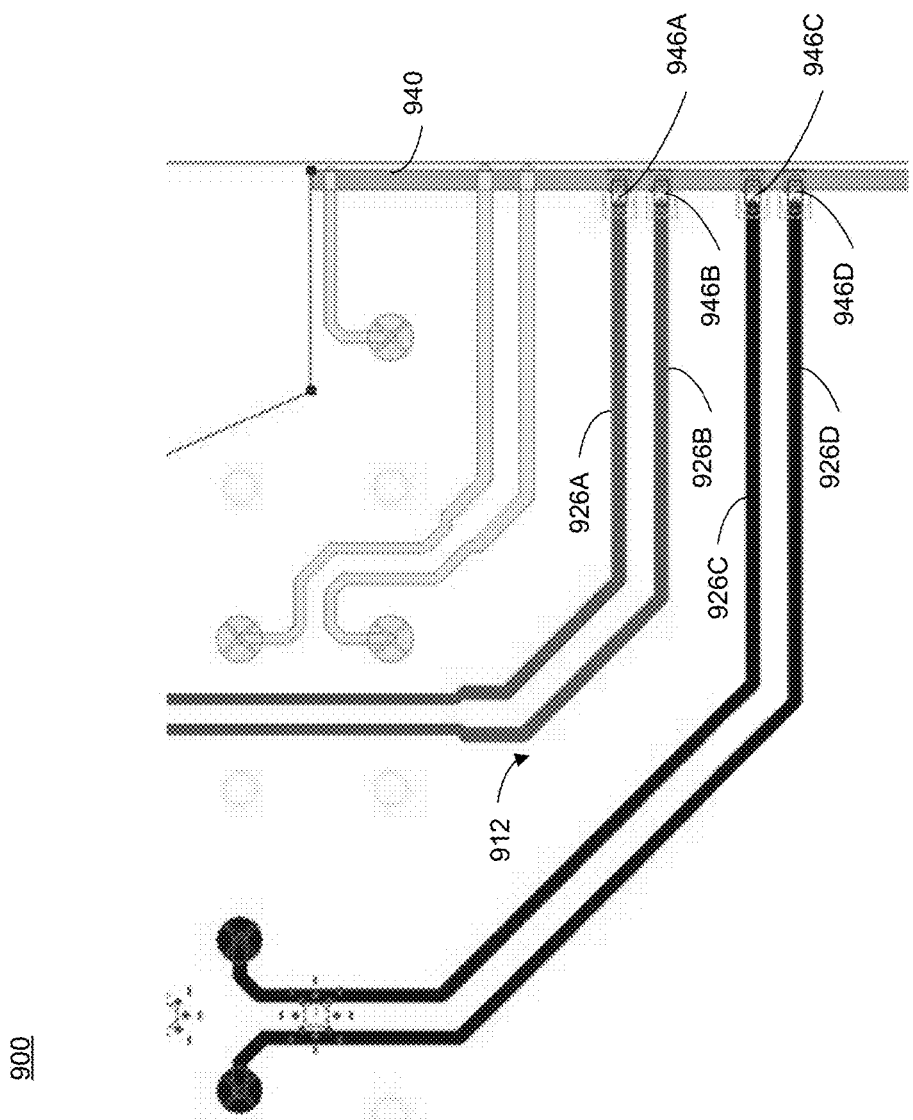
FIG. 9 is a schematic depicting aspects of the electronic circuit design modeling process in accordance with an embodiment of the present disclosure.
Figure 10:
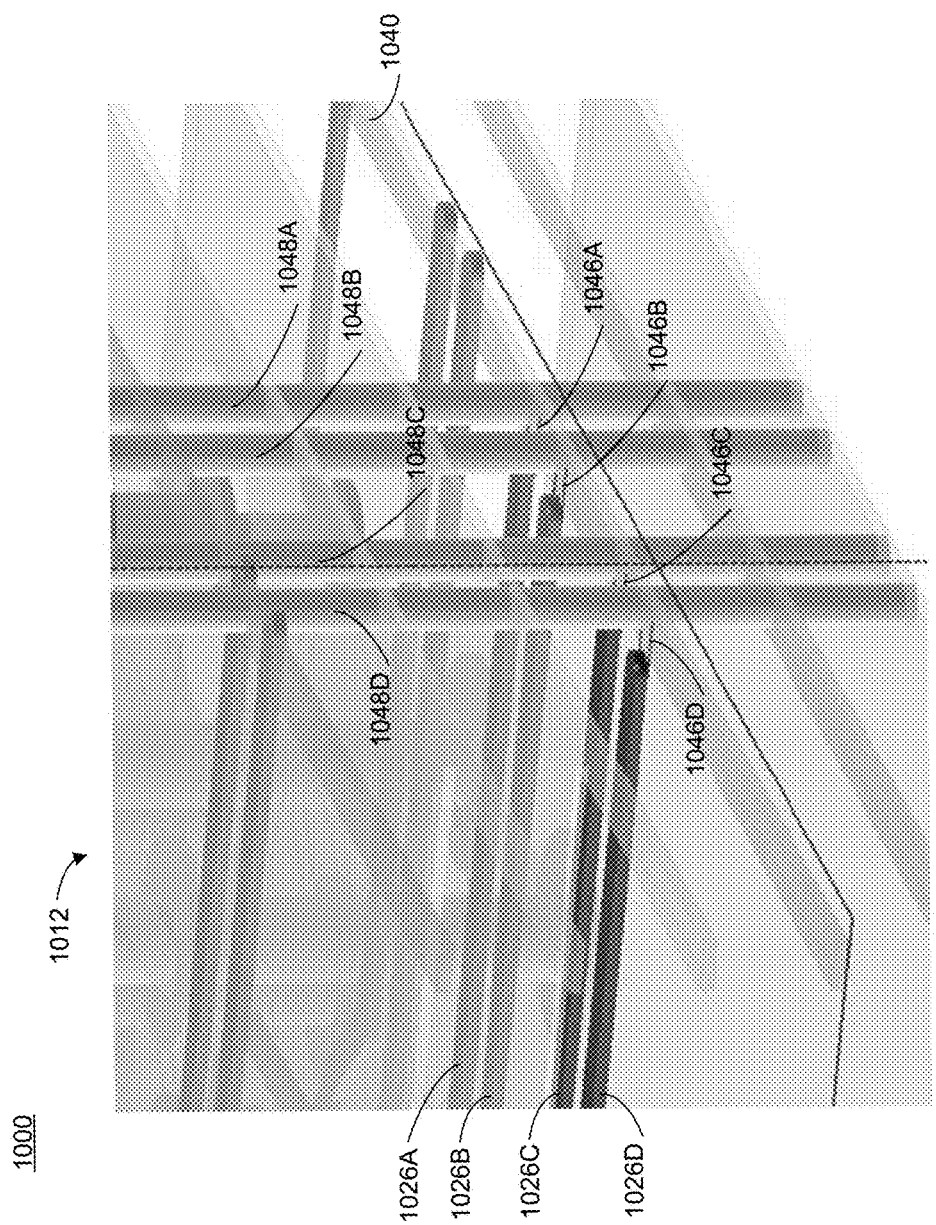
FIG. 10 is a schematic depicting aspects of the electronic circuit design modeling process in accordance with an embodiment of the present disclosure.

Referring also to FIGS. 9 and 10, a portion of an electronic circuit design 1012 with one or more ports is provided. The one or more ports 1046A, 1046B, 1046C, 1046D, the one or more edge shapes 1040, and the one or more vias 1048A, 1048B, 1048C, 1048D may be generated based upon, at least in part, one or more of the one or more traces 1026A, 1026B, 1026C, 1026D and the graphical user interface of FIG. 8. In some embodiments, the one or more ports 1046A, 1046B, 1046C, 1046D, the one or more edge shapes 1040, and the one or more vias 1048A, 1048B, 1048C, 1048D may be generated based upon, at least in part, the results and/or selections within the graphical user interface of FIG. 8. In some embodiments, generating the one or more ports may be based upon, at least in part, minimizing the parasitic capacitance and inductance introduced into one or more sub-zones.

Figure 11:
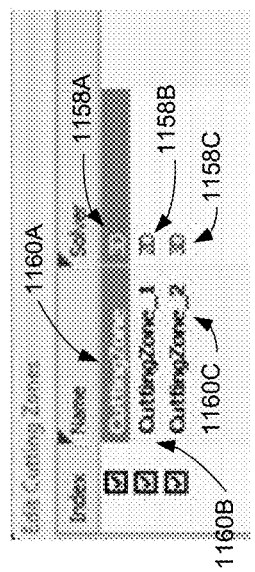
FIG. 11 is a schematic depicting aspects of the electronic circuit design modeling process in accordance with an embodiment of the present disclosure.
Figure 13:
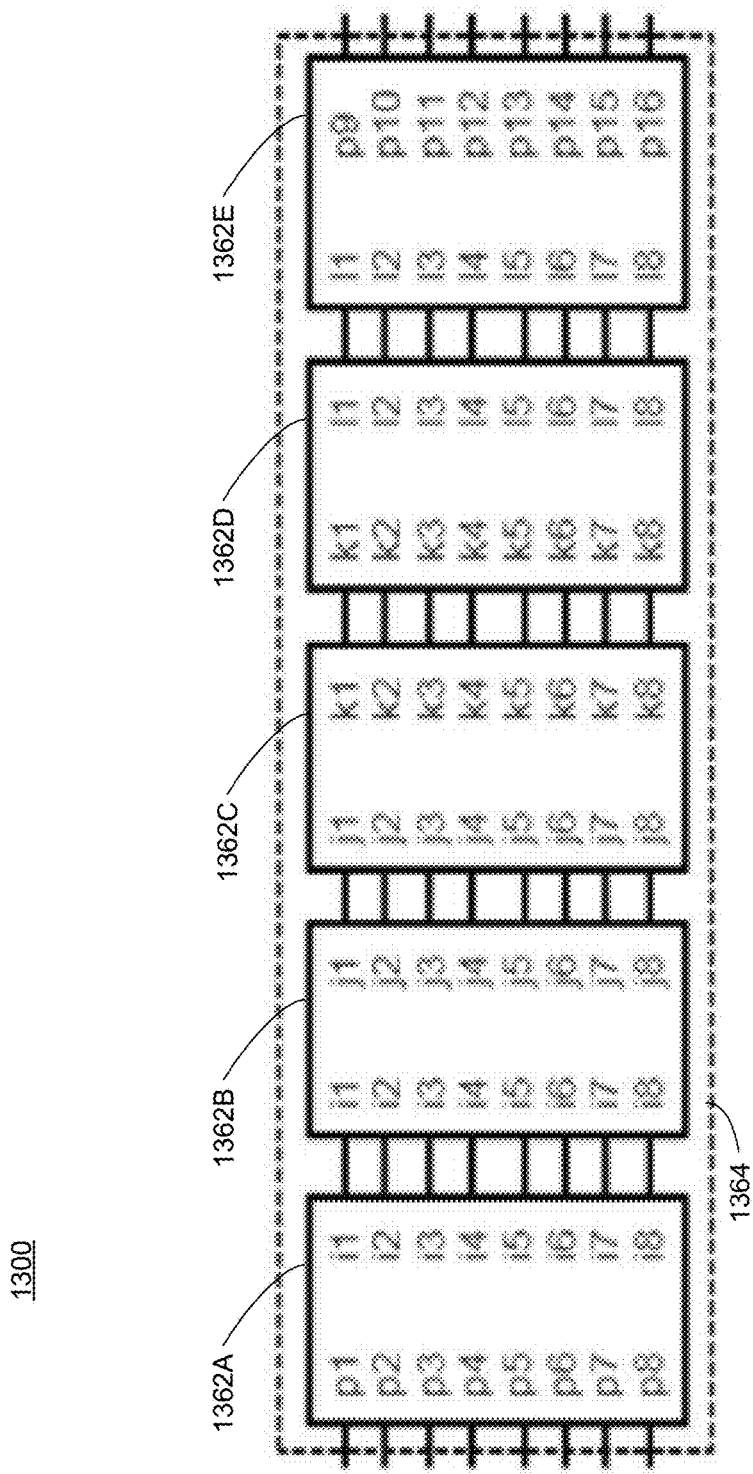
FIG. 13 is a schematic depicting aspects of the electronic circuit design modeling process in accordance with an embodiment of the present disclosure.

In some embodiments and referring also to FIG. 11, ECDM process 10 may further include receiving (208), at the graphical user interface, a selection for an electromagnetic (EM) solver for each of the one or more sub-zones. An EM solver may include, but is not limited to, a program that analyzes how an electromagnetic wave behaves in at least a portion of an electronic circuit design based upon, at least in part, solving one or more of Maxwell's equations using one or more of a finite difference (FD) and/or a finite element (FEM) method. Such methods as are well known in the art. In some embodiments, the EM solver may be one or more of a 2D EM solver, a 2D transmission line hybrid solver, a 2.5D EM solver, and a 3D full-wave EM solver (e.g., 3D EM solver). A 2D EM solver as used herein may include, but is not limited to, an EM solver that may solve one or more of Maxwell's equations for two dimensions. A 2D transmission line hybrid solver as used herein may include, but is not limited to, an EM solver that may solve Maxwell's equations for a current that may flow in a via and a trace. The current flowing in the via and the trace may include two currents. The first current may induce an electromagnetic field, resulting in an equal potential between one or more conductive layers surrounding the trace. The second current may induce an electromagnetic field, resulting in a different voltage potential between one or more surrounding conductive layers. The electromagnetic field may radially propagate from a via. A 2.5D EM solver as used herein may include, but is not limited to, an EM solver that may analyze 3D structures (e.g., electronic circuit designs) by assuming zero metal thicknesses for horizontal geometries (e.g., planes, traces, pads, etc.) and/or by cutting a long structure into many small segments, solving each segment with a 2D EM solver, and then cascading all 2D EM solutions into one final solution. A 3D full-wave EM solver and/or a 3D EM solver as used herein may include, but is not limited to, an EM solver that may solve one or more of Maxwell's equations for three dimensions. In some embodiments, a 3D EM solver may solve one or more of Maxwell's equations with a time derivative set to zero while a 3D full-wave EM solver may solve Maxwell's equations for all time derivative coupling terms.

In some embodiments, a 2.5D EM solver may be more accurate than a 2D EM solver and/or a 2D transmission line hybrid solver. The 2.5D EM solver may consider one or more of a transmission line mode propagation (e.g., a 2D cross section extraction) and the discontinuity in a signal path. For example, traces may change references such as at a coupling between signal vias and/or between surrounding ground vias. The 2.5D EM solver may handle a non-ideal ground (e.g., a connection between a trace and a signal via) and the 2D EM solver and/or the 2D transmission line hybrid solver may only handle an ideal ground (e.g., a connection between a trace and a ground via).

A graphical user interface, as shown in FIG. 11, may receive a selection for an EM solver 1158A, 1158B, 1158C for each sub-zone 1160A, 1160B, 1160C. An EM solver may be selected (e.g., a 2D EM solver, a 2.5D EM solver, and/or a 3D EM solver) for each sub-zone based upon, at least in part, its routing and/or references. For example, 3D EM solver 1158A and 1158C may be selected for the two "end" sub-zones 420 and 424 of FIG. 4 (e.g., CuttingZone 1160A and CuttingZone_2 1160C) because these sub-zones 420 and 424 may route to one or more layers above and/or below the current layer. The 2D EM solver 1158B may be selected for the "middle" sub-zone 422 (e.g., CuttingZone_1 1160B) because the sub-zone 422 may have routings confined to the current layer. However, this example is not intended to be limiting and any EM solver may be selected for each sub-zone.

In some embodiments, ECDM process 10 may also include modeling (210), each of the one or more sub-zones. Modeling as used herein may include, but is not limited to, simulating each of the one or more sub-zones based upon, at least in part, the selected EM solver for each sub-zone. In some embodiments, modeling may include performing signal integrity (SI) analysis based upon, at least in part, the selected EM solver for each sub-zone. In some embodiments, modeling each of the one or more sub-zones may include determining one or more S-parameters for each of the one or more sub-zones. ECDM process 10 may also include extracting the one or more network parameters, such as S-parameters, for each of the one or more sub-zones. ECDM process 10 may include generating separate files (e.g., Touchstone SNP files or any other file that may document network parameters and/or S-parameters) for each of the one or more sub-zones.

In some embodiments, ECDM process 10 may include modeling the at least one portion of the electronic circuit design based upon, at least in part, the modeling of each of the one or more sub-zones. ECDM process 10 may include stitching the one or more S-parameters of each sub-zone. Stitching as used herein may include, but is not limited to, combining the S-parameters of one or more sub-zones to determine the network parameters of the combination of the one or more sub-zones. In some embodiments, a signal flow graph may be used to stitch the S-parameters from each of the one or more sub-zones together into a combined S-parameter file. A signal flow graph as used herein may include, but is not limited to, a diagram that may represent a set of simultaneous linear algebraic equations associated with the S-parameters of each sub-zone of the one or more sub-zones. While S-parameters have been discusses above, ECDM process 10 may include stitching any network parameter for each sub-zone.

Figure 12:
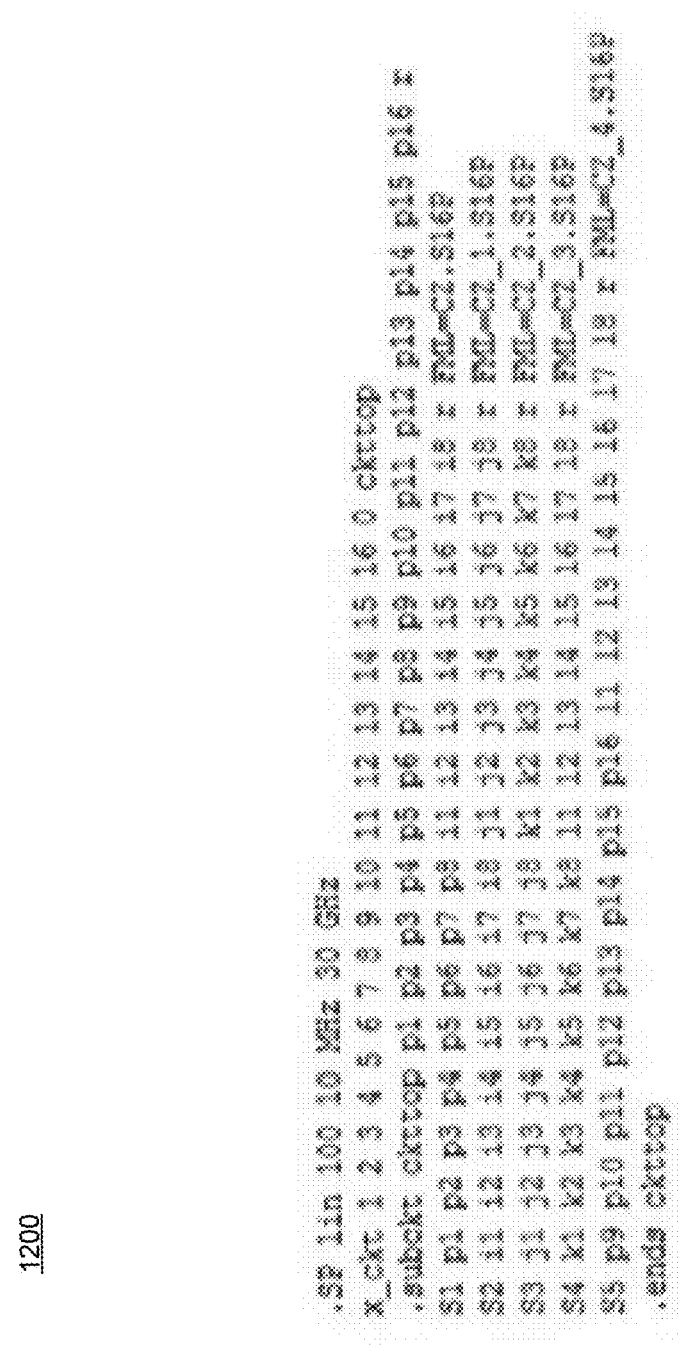

In some embodiments and as shown in FIG. 12, a circuit network topology aid file 1200 may be used to combine the S-parameters of each of the one or more sub-zones. In some embodiments, the circuit network topology aid file 1200 may be a SPICE format circuit simulation file. In some embodiments and referring also to FIG. 13, a combined S-parameter file 1300 (e.g., a Touchstone SNP file, or other network parameter file) for the at least one portion of the electronic circuit design may include one or more S-parameter modules 1362A, 1362B, 1362C, 1362D, 1362E and a cascade frame 1364.

In some embodiments, ECDM process 10 may automatically send each sub-zone modeling task to one or more computers to perform parallel modeling. In some embodiments, ECDM process 10 may reuse a sub-zone's previous existing results to avoid redundant calculation. The simulation for each of the one or more sub-zones may be done in parallel for additional simulation speed gain. In some embodiments, ECDM process 10 may perform any and/or all of the above steps automatically to save a user's efforts and to achieve higher accuracy. In some embodiments, automatically generated TCL script commands may be provided for flexible use of ECDM process 10.

In some embodiments, ECDM process 10 may reduce computer run time and computer resource (memory) requirements. The S-parameter extraction time may be reduced without sacrificing accuracy. In some embodiments, a speedup ratio of more than ten times compared to the traditional 3D EM solvers may be observed when utilizing ECDM process 10.

In some embodiments, EDA application 20 may support a variety of languages and/or standards. Some of these may include, but are not limited to, IEEE-standard languages, the OPEN VERIFICATION METHODOLOGY (OVM), the emerging ACCELLERA UNIVERSAL VERIFICATION METHODOLOGY (UVM), and the E REUSE METHODOLOGY (eRM). EDA application 20 may support e, OPEN VERIFICATION LIBRARY (OVL), OVM class library, emerging UVM class library, SystemC®, SystemC Verification Library®, SystemVerilog®, Verilog®, VHDL, PSL, SVA, CPF, as well as numerous other languages. EDA application 20 may be used in accordance with mixed-language, mixed-signal, and low-power designs, across multiple levels of abstraction, and may include the ability to "hot swap" the RTL simulation in/out of numerous accelerators/emulators.

As used in any embodiment described herein, the terms "circuit" and "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof. Embodiments of the present disclosure may be incorporated in whole or in part into any design tools.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a standalone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for modeling an electronic circuit design comprising:
   receiving, at one or more computing devices, an electronic circuit design;
   partitioning, at a first graphical user interface configured to display at least a portion of the electronic circuit design, at least one portion of the electronic circuit design into one or more sub-zones;
   displaying a plurality of user-editable parameters at a second graphical user interface;
   generating, at the first graphical user interface, one or more ports at each interface between one or more sub-zones based upon, at least in part, the plurality of user-selectable parameters at the second graphical user interface;
   receiving a selection for an electromagnetic (EM) solver for each of the one or more sub-zones, wherein at least two of the one or more sub-zones use a different EM solver; and
   modeling each of the one or more sub-zones.

2. The computer-implemented method of claim 1, further comprising:
   modeling the at least one portion of the electronic circuit design based upon, at least in part, the modeling of each of the one or more sub-zones.

3. The computer-implemented method of claim 1, wherein modeling each of the one or more sub-zones is based upon, at least in part, the EM solver for each of the one or more subzones.

4. The computer-implemented method of claim 1, wherein the EM solver is one or more of a 2D EM solver, a 2D transmission line hybrid solver, a 2.5D EM solver, and a 3D full-wave EM solver.

5. The computer-implemented method of claim 1, further comprising:
   reducing a trace length of one or more traces at one or more ends at each interface between the one or more sub-zones.

6. The computer-implemented method of claim 5, further comprising:
   generating one or more edge shapes to align with each interface between one or more sub-zones.

7. The computer-implemented method of claim 6, further comprising:
   routing the one or more ports from the one or more traces to the one or more edge shapes.

8. The computer-implemented method of claim 7, further comprising:
   generating one or more simulated connections on the one or more edge shapes to interconnect one or more sub-zones with one or more portions of the electronic circuit design.

9. The computer-implemented method of claim 1, wherein modeling each of the one or more sub-zones includes determining one or more S-parameters for each of the one or more sub-zones.

10. A computer-readable storage medium having stored thereon instructions that when executed by a machine result in the following operations:

receiving, at one or more computing devices, an electronic circuit design;

partitioning, at a first graphical user interface configured to display at least a portion of the electronic circuit design, at least one portion of the electronic circuit design into one or more sub-zones;

displaying a plurality of user-editable parameters at a second graphical user interface;

generating, at the first graphical user interface, one or more ports at each interface between one or more sub-zones based upon, at least in part, the plurality of user-selectable parameters at the second graphical user interface;

receiving a selection for an electromagnetic (EM) solver for each of the one or more sub-zones, wherein at least two of the one or more sub-zones use a different EM solver; and modeling each of the one or more sub-zones.

11. The computer-readable storage medium of claim 10, further comprising:

modeling the at least one portion of the electronic circuit design based upon, at least in part, the modeling of each of the one or more sub-zones.

12. The computer-readable storage medium of claim 10, wherein modeling each of the one or more sub-zones is based upon, at least in part, the EM solver for each of the one or more subzones.

13. The computer-readable storage medium of claim 10, wherein the EM solver is one or more of a 2D EM solver, a 2D transmission line hybrid solver, a 2.5D EM solver, and a 3D full-wave EM solver.

14. The computer-readable storage medium of claim 10, wherein operations further comprise:

reducing a trace length of one or more traces at one or more ends at each interface between the one or more sub-zones.

15. The computer-readable storage medium of claim 14, wherein operations further comprise:

generating one or more edge shapes to align with each interface between the one or more sub-zones.

16. The computer-readable storage medium of claim 15, wherein operations further comprise:

routing the one or more ports from the one or more traces to the one or more edge shapes.

17. The computer-readable storage medium of claim 16, wherein operations further comprise: generating one or more simulated connections on the one or more edge shapes to interconnect one or more sub-zones with one or more portions of the electronic circuit design.

18. The computer-implemented method of claim 10, wherein modeling each of the one or more sub-zones includes determining one or more S-parameters for each of the one or more sub-zones.

19. A system for determining an effective electrical resistance in an electronic circuit design comprising:

a computing device having at least one processor configured to receive an electronic circuit design, the at least one processor further configured to partition, at a first graphical user interface configured to display at least a portion of the electronic circuit design, at least one portion of the electronic circuit design into one or more sub-zones, the at least one processor further configured to display a plurality of user-editable parameters at a second graphical user interface, the at least one processor further configured to generate, at the first graphical user interface, one or more ports at each interface between one or more sub-zones based upon, at least in part, the plurality of user-selectable parameters at the second graphical user interface, the at least one processor further configured to receive a selection for an electromagnetic (EM) solver for each of the one or more sub-zones, wherein at least two of the one or more sub-zones use a different EM solver, and the at least one processor further configured to model each of the one or more sub-zones.

20. The system of claim 19, wherein the at least one processor is further configured to model the at least one portion of the electronic circuit design based upon, at least in part, the modeling of each of the one or more sub-zones.

* * * * *